(12) United States Patent
Jin et al.

(10) Patent No.: US 12,433,048 B2
(45) Date of Patent: Sep. 30, 2025

(54) SEMICONDUCTOR DEVICE INCLUDING MULTIPLE SOURCES AND IMAGE SENSOR INCLUDING THE SEMICONDUCTOR DEVICE

(71) Applicant: Samsung Electronics Co., Ltd., Suwon-si (KR)

(72) Inventors: Young Gu Jin, Osan-si (KR); Jung Chak Ahn, Yongin-si (KR); Won Seok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 587 days.

(21) Appl. No.: 17/857,082

(22) Filed: Jul. 4, 2022

(65) Prior Publication Data

US 2023/0143634 A1    May 11, 2023

(30) Foreign Application Priority Data

Nov. 11, 2021 (KR) .................. 10-2021-0154774
Jan. 27, 2022 (KR) .................. 10-2022-0012312

(51) Int. Cl.
*H10F 39/00* (2025.01)

(52) U.S. Cl.
CPC .................. *H10F 39/8037* (2025.01)

(58) Field of Classification Search
CPC ......... H01L 27/14612; H01L 29/42356; H01L 27/14605; H01L 27/14614; H01L 29/41725; H01L 29/41775
USPC ........................................... 257/287
See application file for complete search history.

(56) References Cited

U.S. PATENT DOCUMENTS

| | | | |
|---|---|---|---|
| 7,137,089 B1 | 11/2006 | Kong | |
| 7,906,802 B2 | 3/2011 | Baumgartner et al. | |
| 7,939,861 B2 | 5/2011 | Horch | |
| 2009/0159967 A1* | 6/2009 | Edwards | H01L 29/4238 257/E29.256 |
| 2012/0139046 A1* | 6/2012 | Tan | H01L 29/7835 257/347 |
| 2020/0105808 A1 | 4/2020 | Tagawa et al. | |
| 2020/0312728 A1* | 10/2020 | Altun | H01L 21/823871 |
| 2020/0357835 A1 | 11/2020 | Ma | |
| 2021/0126097 A1 | 4/2021 | Ju et al. | |
| 2021/0242319 A1* | 8/2021 | Sheridan | H01L 29/36 |

\* cited by examiner

*Primary Examiner* — Eva Y Montalvo
*Assistant Examiner* — Nicholas B Michaud
(74) *Attorney, Agent, or Firm* — Muir Patent Law, PLLC

(57) ABSTRACT

Disclosed is a semiconductor device including a substrate, a gate structure on the substrate, and including first and second sides extended in parallel with a first direction and spaced apart from each other in a second direction, and a third side extended in parallel with the second direction, and a plurality of source/drain areas including first and second source/drain areas spaced apart from each other in the second direction and a third source/drain area spaced apart from at least one of the first or second source/drain area in the first direction, the first and second source/drain areas overlap the first and second sides, respectively, the third source/drain area overlaps one of the first side or the third side, and a voltage applied to the first and second source/drain areas and a voltage applied to the third source/drain area operate based on their respective values different from each other.

19 Claims, 17 Drawing Sheets

SEMICONDUCTOR DEVICE INCLUDING MULTIPLE SOURCES AND IMAGE SENSOR INCLUDING THE SEMICONDUCTOR DEVICE

CROSS-REFERENCE TO RELATED APPLICATIONS

This application claims priority under 35 U.S.C. § 119 from Korean Patent Application No. 10-2021-0154774, filed on Nov. 11, 2021, and Korean Patent Application No. 10-2022-0012312, filed on Jan. 27, 2022, in the Korean Intellectual Property Office, the entire contents of both of which are herein incorporated by reference.

BACKGROUND

Technical Field

The present disclosure relates to a semiconductor device and an image sensor including the semiconductor device.

Description of the Related Art

As a feature size of a MOS transistor is reduced, a length and width of a gate and a length and width of a channel formed below the gate are also reduced. As a channel length of the transistor is reduced, a magnitude of an electric field applied from the channel is increased, and dispersion of characteristics such as a threshold voltage is increased. The decrease in the channel width of the transistor affects the increase in characteristic dispersion, and in this case, a problem occurs in that performance such as transconductance is reduced. Such characteristic degradation may be an obstacle in a product, such as an image sensor, which uses a transistor as a readout circuit.

Therefore, various studies for improving characteristic dispersion and performance in a transistor are ongoing.

BRIEF SUMMARY

An object of the present disclosure is to provide a semiconductor device in which operation performance of a transistor is improved.

According to an embodiment of the present disclosure, there is a semiconductor device comprising a substrate extended in first and second directions crossing each other, a gate structure disposed on the substrate, the gate structure including first and second sides extended in parallel with the first direction and spaced apart from each other in the second direction, and a third side extended in parallel with the second direction, and a plurality of source/drain areas of a first conductive type, which are disposed in the substrate, wherein the plurality of source/drain areas include first and second source/drain areas spaced apart from each other in the second direction and a third source/drain area spaced apart from at least one of the first or second source/drain area in the first direction, wherein the first and second source/drain areas overlap the first and second sides in a third direction perpendicular to the first and second directions, respectively, wherein the third source/drain area overlaps one of the first side or the third side in the third direction, and wherein a voltage applied to the first and second source/drain areas and a voltage applied to the third source/drain area operate based on their respective values different from each other.

According to the aforementioned and other embodiments of the present disclosure, there is provided a semiconductor device comprising a substrate extended in first and second directions crossing each other, a gate structure disposed on the substrate, including first and second sides extended in parallel with the first direction and spaced apart from each other in the second direction, and a source/drain area disposed in the substrate to overlap at least one of the first or second sides of the gate structure in a third direction perpendicular to the first and second directions, and having first conductive type impurities, wherein the source/drain area includes a plurality of source areas and at least one drain area spaced apart from each of the plurality of source areas.

According to the aforementioned and other embodiments of the present disclosure, there is provided an image sensor comprising a gate structure to which a voltage according to charges accumulated by a light sensing element is applied, the gate structure including first and second sides extended in parallel with a first direction and spaced apart from each other in a second direction crossing the first direction, and a third side extended in parallel with the second direction, and a source follower transistor including a plurality of source/drain areas of a first conductive type, wherein the plurality of source/drain areas include first and second source/drain areas spaced apart from each other in the second direction and a third source/drain area spaced apart from at least one of the first or second source/drain area in the first direction, wherein the first and second source/drain areas overlap the first and second sides in a third direction perpendicular to the first and second directions, respectively, wherein the third source/drain area overlaps one of the first side or the third side in the third direction, and wherein a voltage applied to the first and second source/drain areas and a voltage applied to the third source/drain area operate based on their respective values different from each other.

The objects of the present disclosure are not limited to those mentioned above and additional objects of the present disclosure, which are not mentioned herein, will be clearly understood by those skilled in the art from the following description of the present disclosure.

BRIEF DESCRIPTION OF THE DRAWINGS

The above and other aspects and features of the present disclosure will become more apparent by describing in detail exemplary embodiments thereof with reference to the attached drawings, in which like numerals refer to like elements throughout. In the drawings.

DETAILED DESCRIPTION OF THE DISCLOSURE

Hereinafter, a semiconductor device according to some example embodiments of the present disclosure will be described with reference to FIGS. 1 to 5.

Figure 1:
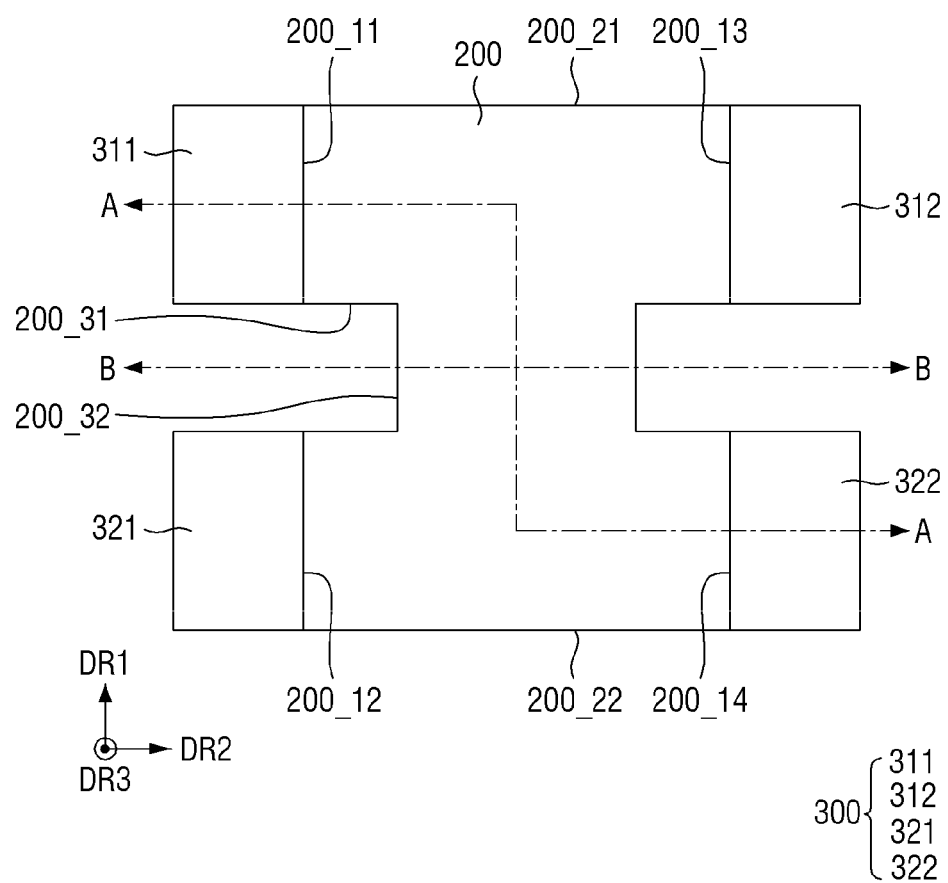
FIG. 1 is a schematic layout view illustrating a semiconductor device, according to some example embodiments of the present disclosure.
Figure 2:
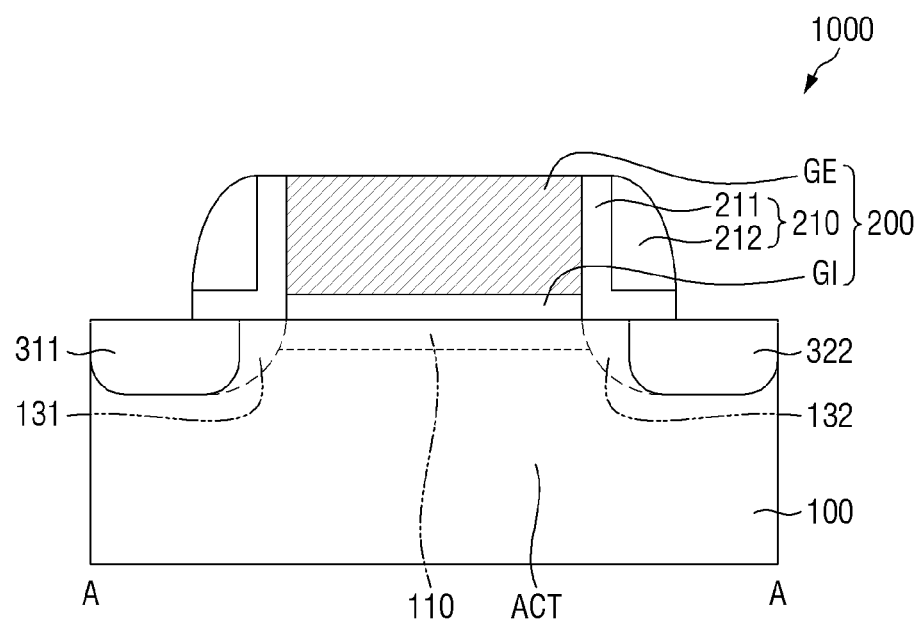
FIG. 2 is a cross-sectional view taken along line A-A of FIG. 1.
Figure 3:
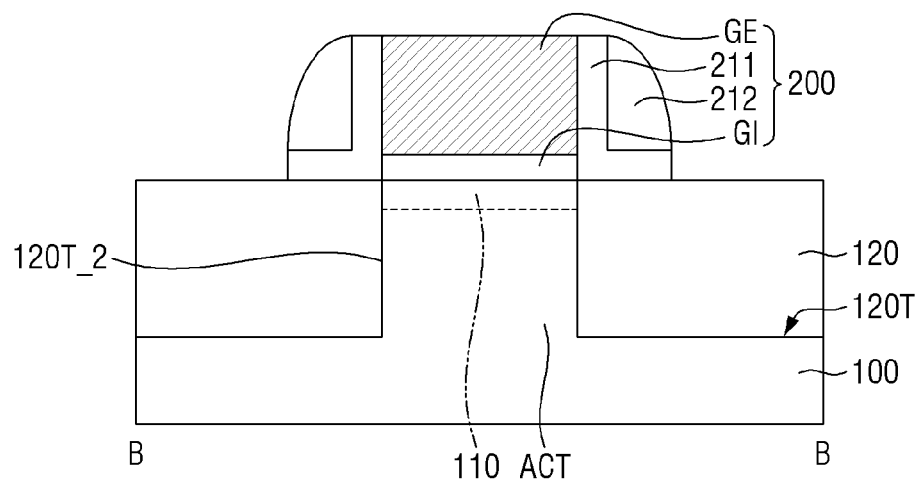
FIG. 3 is a cross-sectional view taken along line B-B of FIG. 1.
Figure 4:
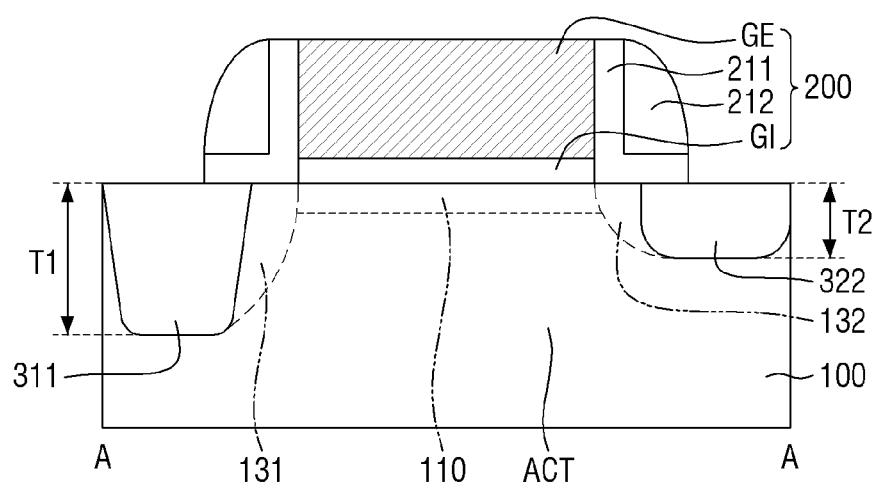
FIG. 4 is a view illustrating a semiconductor device, according to some example embodiments of the present disclosure.
Figure 5:
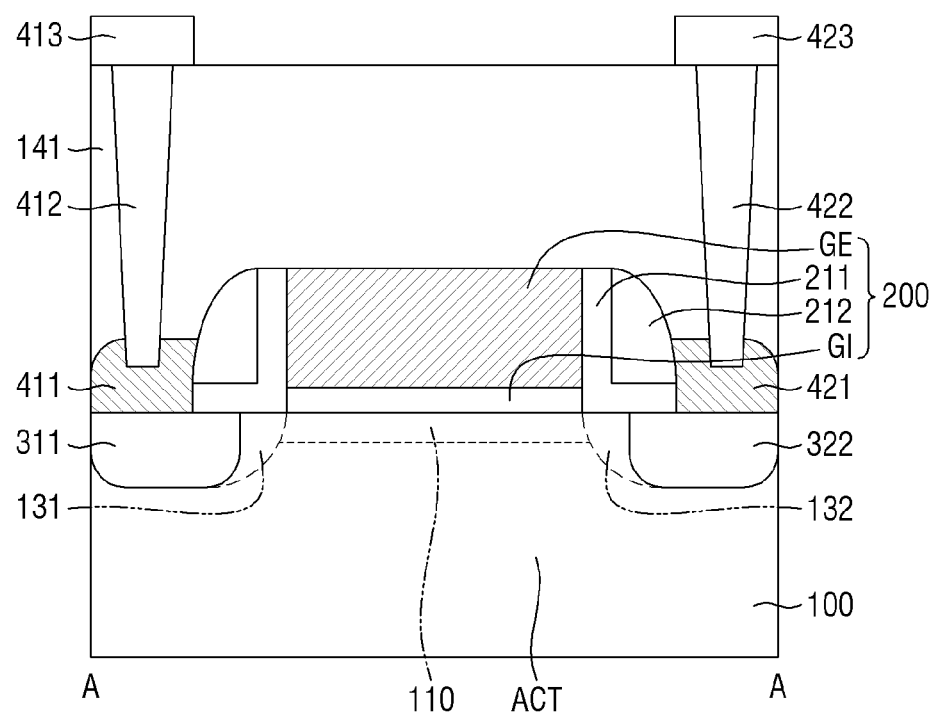
FIG. 5 is a view illustrating a semiconductor device, according to some example embodiments of the present disclosure.

FIG. 1 is a schematic layout view illustrating a semiconductor device according to some example embodiments of the present disclosure. FIG. 2 is a cross-sectional view taken along line A-A of FIG. 1. FIG. 3 is a cross-sectional view taken along line B-B of FIG. 1. FIG. 4 is a view illustrating a semiconductor device according to some example embodiments of the present disclosure. FIG. 5 is a view illustrating a semiconductor device according to some example embodiments of the present disclosure.

Referring to FIGS. 1 to 5, a semiconductor device 1000 according to some example embodiments of the present disclosure may include a substrate 100, a gate structure 200 and a plurality of source/drain areas 300.

The substrate 100 may be extended in a first direction DR1 and a second direction DR2, which cross each other.

In some embodiments, the substrate 100 may include an N-type transistor forming area. Alternatively, the substrate 100 may include a P-type transistor forming area.

The substrate 100 may include, for example, a bulk silicon, a silicon-on-insulator (SOI), a silicon substrate, silicon germanium, a silicon germanium on insulator (SGOI), silicon carbide, indium antimonide, lead telluride compound, indium arsenide, indium phosphide, gallium arsenide or gallium antimonide, but is not limited thereto.

In some embodiments, the substrate 100 will be described as being a silicon substrate that includes silicon.

A trench 120T may be formed in the substrate 100 to define an active area ACT between the substrate 100 and the gate structure 200 that will be described later. In some embodiments, the trench 120T may form a shallow trench isolation structure.

An insulating layer 120 may be formed to fill the inside of the trench 120T. The insulating layer 120 may be formed of a dielectric oxide material such as silicon oxide, silicon oxynitride, or their combination, but is not limited thereto.

Referring to FIG. 2, an ion implantation layer 110 for controlling a threshold voltage may be disposed on the substrate 100 below the gate structure 200. The ion implantation layer 110 for controlling a threshold voltage may include impurities of a conductive type different from that included in the substrate 100, but the technical spirits of the present disclosure are not limited thereto.

The semiconductor device 1000 may include a gate structure 200 on the substrate 100. The gate structure 200 may include a gate insulating layer GI, a gate electrode GE on the gate insulating layer GI, and a spacer structure 210. The gate insulating layer GI may include a silicon oxide layer, or a high-k dielectric layer having a dielectric constant greater than that of the silicon oxide layer.

Although not shown in detail, the gate electrode GE may include a metal gate electrode layer and/or a semiconductor gate electrode layer. The metal gate electrode layer may include a conductive metal nitride layer such as a titanium nitride layer, a tantalum nitride layer, and a tungsten nitride layer. The semiconductor gate electrode layer may include polycrystalline silicon.

Although not shown in detail, a contact electrode may be provided on the gate electrode GE. The contact electrode may include a metal-semiconductor compound. For example, the contact electrode may include a metal silicide material such as titanium silicide or nickel silicide.

Referring to FIGS. 1 and 2, the gate structure 200 may include a (1_1)th side 200_11, a (1_2)th side 200_12, a (1_3)th side 200_13, and a (1_4)th side 200_14, which are extended lengthwise in parallel with a first direction DR1.

The (1_1)th side 200_11 and the (1_2)th side 200_12 may be spaced apart from each other to face each other based on the first direction DR1, and the (1_3)th side 200_13 and the (1_4)th side 200_14 may be spaced apart from each other to face each other based on the first direction DR1. The (1_1)th side 200_11 and the (1_3)th side 200_13 may be spaced apart from each other to face each other based on the second direction DR2, and the (1_2)th side 200_12 and the (1_4)th side 200_14 may be spaced apart from each other to face each other based on the second direction DR2.

The gate structure 200 may also include a (2_1)th side 200_21 and a (2_2)th side 200_22, which are extended in parallel with the second direction DR2. The (2_1)th side 200_21 and the (2_2)th side 200_22 may be spaced apart from each other to face each other based on the first direction DR1.

In some embodiments, the (1_1)th side 200_11, the (1_2)th side 200_12, the (1_3)th side 200_13, the (1_4)th side 200_14, the (2_1)th side 200_21, and the (2_2)th side 200_22 of the gate structure 200 may refer to sidewalls of the gate electrode GE, which will be described later, or sidewalls of the gate structure 200 that includes the spacer structure 210. Further, first and second inner walls 200_31 and 200_32 of the gate structure 200 may refer to inner walls of the gate electrode GE or inner walls of the gate structure 200 that includes the spacer structure 210.

The gate structure 200 may include first inner walls 200_31 extended along a second direction DR2 from the (1_1)th and (1_2)th sides 200_11 and 200_12, respectively, and a second inner wall 200_32 connected to the first inner walls 200_31 and extended along the first direction DR1. The second inner wall 200_32 may be perpendicular to the first inner walls 200_31. In this case, referring to FIG. 1, the gate structure 200 may have an I-shape.

The first and second inner walls 200_31 and 200_32 of the gate structure 200 may refer to exposed areas of the gate structure 200, which are formed by etching at least a portion of the gate structure 200. In some embodiments, the etching method of the gate structure 200 is not particularly limited if at least a portion of the gate structure 200 is able to be etched. In some embodiments, the second inner wall 200_32 of the gate structure 200 may correspond to side surfaces of the gate electrode GE and gate insulating layer GI.

The spacer structure 210 may be provided on the sidewall of the gate electrode GE. The spacer structure 210 may include a first spacer pattern 211 and a second spacer pattern 212, which are sequentially stacked on the sidewall of the gate electrode GE. For example, the second spacer pattern 212 may be thicker than the first spacer pattern 211, but the technical spirits of the present disclosure are not limited thereto. The first spacer pattern 211 may be formed between the second spacer pattern 212 and the gate electrode GE, between the second spacer pattern 212 and the gate insulating layer GI, and between the second spacer pattern 212 and the substrate 100. The first spacer pattern 211 may contact side surfaces of the gate electrode GE and the gate insulating layer GI and top surfaces of the substrate 100 and the insulating layer 120.

The second spacer pattern 212 may include an etching selective material with respect to the first spacer pattern 211. For example, the second spacer pattern 212 may include silicon oxide, and the first spacer pattern 211 may include silicon nitride, but the technical spirits of the present disclosure are not limited thereto.

The plurality of source/drain areas 300 may be provided in the substrate 100. The plurality of source/drain areas 300 may include first conductive type impurities or second conductive type impurities different from the first conductive type impurities depending on a type of the semiconductor device 1000. For example, the first conductive type may be N-type when the semiconductor device 1000 is an N-type transistor, and the second conductive type may be P-type when the semiconductor device 1000 is a P-type transistor.

Referring to FIGS. 1 and 2, the plurality of source/drain areas 300 may include first and second source/drain areas 311 and 312, which overlap the (1_1)th side 200_11 and the (1_3)th side 200_13 of the gate structure 200 in a third direction DR3, respectively, and spaced apart from each other to face each other in the second direction DR2, and a third source/drain area 321 that overlaps the (1_2)th side 200_12 of the gate structure 200 in the third direction DR3 and spaced apart from at least one of the first or second source/drain areas 311 or 312 in the first direction DR1.

In some embodiments, the first and second source/drain areas 311 and 312 may be source areas, and the third source/drain area 321 may be a drain area. A magnitude of a voltage applied to the first and second source/drain areas 311 and 312 may be different from that of a voltage applied to the third source/drain area 321. In this case, the voltage applied to the first and second source/drain areas 311 and 312 may operate based on a value different from the voltage applied to the third source/drain area 321.

For example, when the semiconductor device 1000 is an N-type transistor, the voltage applied to the third source/drain area 321, which is a drain area, may be greater than that applied to the first and second source/drain areas 311 and 312, which are source areas. Alternatively, for example, when the semiconductor device 1000 is a P-type transistor, the voltage applied to the third source/drain area 321, which is a drain area, may be smaller than that applied to the first and second source/drain areas 311 and 312, which are source areas.

Meanwhile, unlike the above example, the first and second source/drain areas 311 and 312 may be drain areas, and the third source/drain area 321 may be a source area. The magnitude of the voltage applied to the first and second source/drain areas 311 and 312 may be different from that of the voltage applied to the third source/drain area 321.

For example, when the semiconductor device 1000 is a P-type transistor, the voltage applied to the third source/drain area 321, which is a source area, may be greater than that applied to the first and second source/drain areas 311 and 312, which are drain areas. Alternatively, for example, when the semiconductor device 1000 is an N-type transistor, the voltage applied to the third source/drain area 321, which is a source area, may be smaller than that applied to the first and second source/drain areas 311 and 312, which are drain areas.

The plurality of source/drain areas 300 may further include a fourth source/drain area 322 that overlaps the (1_4)th side 200_14 of the gate structure 200 in the third direction DR3 and is spaced apart from each of the first and second source/drain areas 311 and 312 in the first direction DR1.

In some embodiments, the first and second source/drain areas 311 and 312 may be source areas, and the fourth source/drain area 322 may be a drain area. The voltage applied to the first and second source/drain areas 311 and 312 may be different from that applied to the fourth source/drain area 322. In this case, the voltage applied to the first and second source/drain areas 311 and 312 may operate based on a value different from the voltage applied to the fourth source/drain area 322.

In this case, for example, when the semiconductor device 1000 is an N-type transistor, the voltage applied to the fourth source/drain area 322, which is a drain area, may be greater than that applied to the first and second source/drain areas 311 and 312, which are the source area. At this time, when the third source/drain area 321 is a source area, the voltage applied to the fourth source/drain area 322, which is a drain area, may be greater than that applied to the third source/drain area 321. Alternatively, for example, when the semiconductor device 1000 is a P-type transistor, the voltage applied to the fourth source/drain area 322, which is a drain area, may be smaller than that applied to the first and second source/drain areas 311 and 312, which are source areas.

Meanwhile, unlike the above example, the first and second source/drain areas 311 and 312 may be drain areas, and the fourth source/drain area 322 may be a source area. The voltage applied to the first and second source/drain areas 311 and 312 may be different from that applied to the fourth source/drain area 322.

In this case, for example, when the semiconductor device 1000 is a P-type transistor, the voltage applied to the fourth source/drain area 322, which is a source area, may be greater than that applied to the first and second source/drain areas 311 and 312, which are drain areas. Alternatively, for example, when the semiconductor device 1000 is an N-type transistor, the voltage applied to the fourth source/drain area 322, which is a source area, may be smaller than that applied to the first and second source/drain areas 311 and 312, which are drain areas. At this time, when the third source/drain area 321 is a drain area, the voltage applied to the third source/ drain area 321 may be greater than that applied to the fourth source/drain area 322, which is a source area.

In the related art, as a channel length of a transistor is reduced, a problem may occur in that dispersion characteristics of a threshold voltage may be degraded. In some embodiments, the number or size of the source/drain areas in one transistor may be increased to increase a path through which carriers such as charges move. As a result, operation performance of the transistor may be improved under the same size.

Referring to FIG. 1, a length of at least one of the first or second source/drain areas 311 or 312 and a length of the third source/drain area 321 may be substantially the same as each other based on the first direction DR1, but the technical spirits of the present disclosure are not limited thereto. As described below, the lengths of the plurality of source/drain areas 300 in the first direction DR1 may be different from each other. Terms such as "same" or "equal," as used herein, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Lightly doped areas 131 and 132 may be provided in the substrate 100. The lightly doped areas 131 and 132 may be areas doped with a lower concentration than the plurality of source/drain areas 300. The lightly doped areas 131 and 132 may have the same conductive type impurities as those of the plurality of source/drain areas 300. The lightly doped areas 131 and 132 may be areas extended from the plurality of source/drain areas 300 toward the gate electrode GE.

Referring to FIGS. 1 and 3, the trench 120T may include a first side (not shown) extended along the second direction DR2 from the first sides 200_11 and 200_12 of the gate structure 200, and a second side 120T_2 connected to the first side and extended along the first direction DR1. Although not shown in detail, the first side may be formed at the same level as the first inner wall 200_31 of the gate structure 200 in the third direction DR3. The second side 120T_2 may be formed at the same level as the second inner wall 200_32 of the gate structure 200 in the third direction DR3.

The trench 120T may mean an area formed as at least a portion of the substrate 100 is etched. In this case, at least a portion of the substrate 100 may be etched such that the second side 120T_2 is disposed at the same level as the second inner wall 200_32 of the gate structure 200 in the third direction DR3. For example, the second side 120T_2 may be aligned with the second inner wall 200_32 in the third direction DR3.

Referring to FIG. 3, the second side 120T_2 of the trench 120T is shown as being perpendicular to the second direction DR2, but the technical spirits of the present disclosure are not limited thereto. That is, the second side 120T_2 of the trench 120T may be formed to have a slope other than 90° with respect to the second direction DR2 parallel with one surface of the substrate 100. For example, the trench 120T may be formed to be inclined such that the shallow trench isolation structure has a reverse trapezoidal shape.

Referring to FIGS. 1 and 3, the shallow trench isolation structure may be formed between the first and third source/drain areas 311 and 321 and between the second and fourth source/drain areas 312 and 322. In this case, the insulating layer 120 may be disposed between the first and third source/drain areas 311 and 321 spaced apart from each other in the first direction DR1. In addition, the insulating layer 120 may be disposed between the second and fourth source/drain areas 312 and 322 spaced apart from each other in the first direction DR1.

Referring to FIG. 4, depths of the plurality of source/drain areas 300 may be different from each other. For example, a depth T1 of the first source/drain area 311 along the third direction DR3 may be deeper than a depth T2 of the fourth source/drain area 322 along the third direction DR3. Although not shown in detail, the depth T1 of the first source/drain area 311 along the third direction DR3 may be deeper than the depth of the third source/drain area 321 along the third direction DR3. The depths T1 and T2 may be maximum depths of the first source/drain area 311 and the fourth source/drain area 322, respectively.

Although not shown in detail, the depth of the second source/drain area 312 along the third direction DR3 may be deeper than that of the third and fourth source/drain areas 321 and 322 along the third direction DR3.

In some embodiments, the depths of the respective source/drain areas in one transistor may be different from each other, whereby the path through which carriers such as charges move may be increased. As a result, operation performance of the transistor may be further improved under the same area.

Referring to FIG. 5, the semiconductor device 1000 may include source/drain electrodes 411 and 421 provided on sidewalls of the spacer structure 210. The source/drain electrodes 411 and 421 may include a metal-semiconductor compound. For example, the source/drain electrodes 411 and 421 may include a metal silicide material such as titanium silicide or nickel silicide.

An interlayer insulating layer 141 may be provided on the substrate 100 and the gate structure 200. The interlayer insulating layer 141 may include silicon oxide.

Contacts 412 and 422 connected to the source/drain electrodes 411 and 421 by passing through the interlayer insulating layer 141 may be provided. A lower portion of the contacts 412 and 422 may be provided in an upper portion of the source/drain electrodes 411 and 421. Conductive patterns 413 and 423 respectively connected to the contacts 412 and 422 may be provided on the interlayer insulating layer 141. For example, the contacts 412 and 422 and the conductive patterns 413 and 423 may include metals such as copper, aluminum, tungsten, titanium and tantalum, and/or their metal nitrides.

Figure 6:
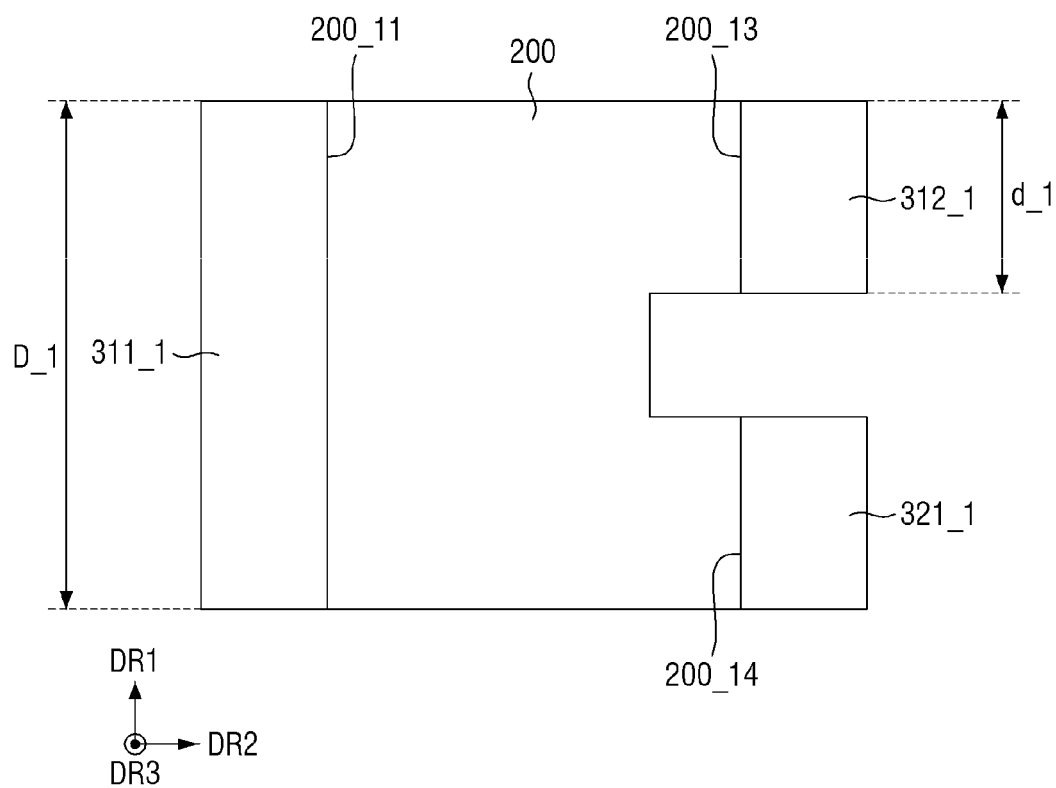
FIG. 6 is a schematic layout view illustrating a semiconductor device, according to some example embodiments of the present disclosure.

FIG. 6 is a schematic layout view illustrating a semiconductor device according to some example embodiments of the present disclosure. For convenience of description, the same or repeated description of that of FIGS. 1 to 5 will be briefly made or omitted.

Referring to FIG. 6, the gate structure 200 may include a first source/drain area 311_1 extended lengthwise in the first direction DR1 to be adjacent to the (1_1)th side 200_11, and second and third source/drain areas 312_1 and 321_1, which are disposed to be adjacent to the (1_3)th side 200_13 and the (1_4)th side 200_14, respectively, and spaced apart from each other in the first direction DR1. Referring to FIG. 6, the gate structure 200 may be a C-shape.

In this case, a length D_1 of the first source/drain area 311_1 along the first direction DR1 may be longer than a length d_1 of the second source/drain area 312_1 and the third source/drain area 321_1 along the first direction DR1. In the example of FIG. 6, the length d_1 of the second source/drain area 312_1 may be the same as the length of the third source/drain area 321_1 along the first direction DR1.

The first source/drain area 311_1 and the second source/drain area 312_1 may be source areas, and the third source/drain area 321_1 may be a drain area, but the technical spirits of the present disclosure are not limited thereto. The first source/drain area 311_1 may be a drain area, and the second and third source/drain areas 312_1 and 321_1 may be source areas.

Although not shown in detail, a depth of the first source/drain area 311_1 along the third direction DR3 may be deeper than that of the second source/drain area 312_1 and the third source/drain area 321_1 along the third direction DR3, but the technical spirits of the present disclosure are not limited thereto. When the first source/drain area 311_1 is a drain area and the third source/drain area 321_1 is a source area, the depth of the third source/drain area 321_1 along the third direction DR3 may be deeper than that of the first source/drain area 311_1 along the third direction DR3.

Figure 7:
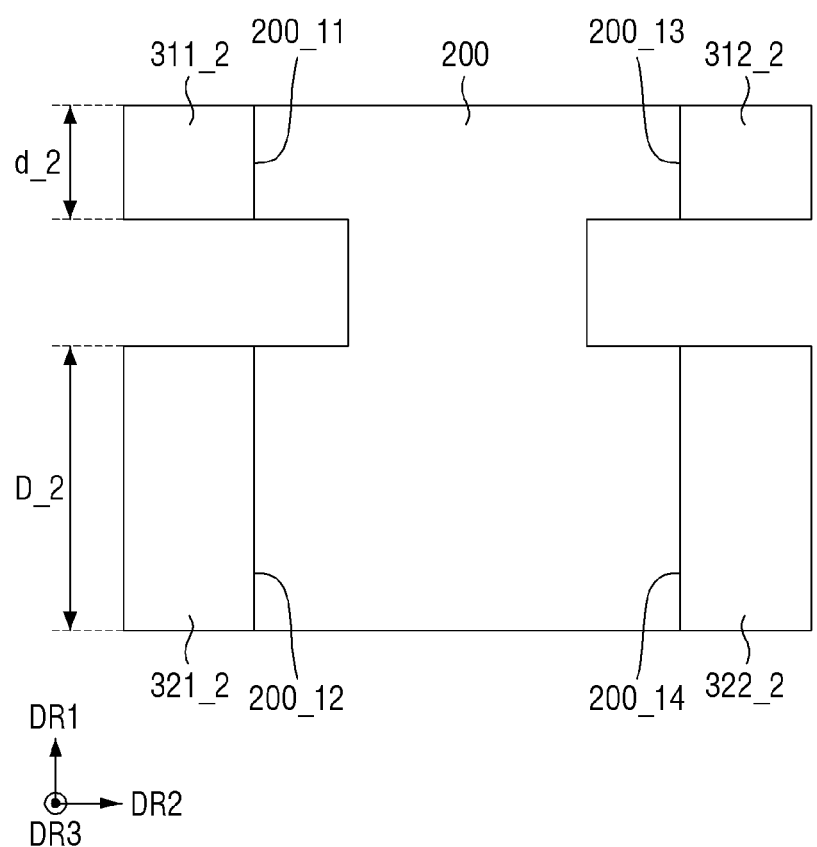
FIG. 7 is a schematic layout view illustrating a semiconductor device, according to some example embodiments of the present disclosure.

FIG. 7 is a schematic layout view illustrating a semiconductor device according to some embodiments of the present disclosure. For convenience of description, the same or repeated description of that of FIGS. 1 to 5 will be briefly made or omitted.

Referring to FIG. 7, lengths of the plurality of source/drain areas 300 along the first direction DR1 may be different from each other. In detail, a length d_2 of the first source/drain area 311_2 along the first direction DR1, which is disposed to be adjacent to the (1_1)th side 200_11 of the gate structure 200, may be shorter than a length D_2 of the third source/drain area 321_2 along the first direction DR1, which is disposed to be adjacent to the (1_2)th side 200_12 of the gate structure 200.

Also, a length of the second source/drain area 312_2 along the first direction DR1, which is disposed to be adjacent to the (1_3)th side 200_13 of the gate structure 200, may be shorter than that of the fourth source/drain area 322_2 along the first direction DR1, which is disposed to be adjacent to the (1_4)th side 200_14 of the gate structure 200. In some embodiments, the length d_2 of the first source/drain area 311_2 along the first direction DR1 may be the same as the length of the second source/drain area 312_2 along the first direction DR1, and the length D_2 of the third source/drain area 321_2 along the first direction DR1 may be the same as the length of the fourth source/drain area 322_2 along the first direction DR1.

In this case, the first source/drain area 311_2 and the second source/drain area 312_2 may be source areas, and the third source/drain area 321_2 and the fourth source/drain area 322_2 may be drain areas.

Figure 8:
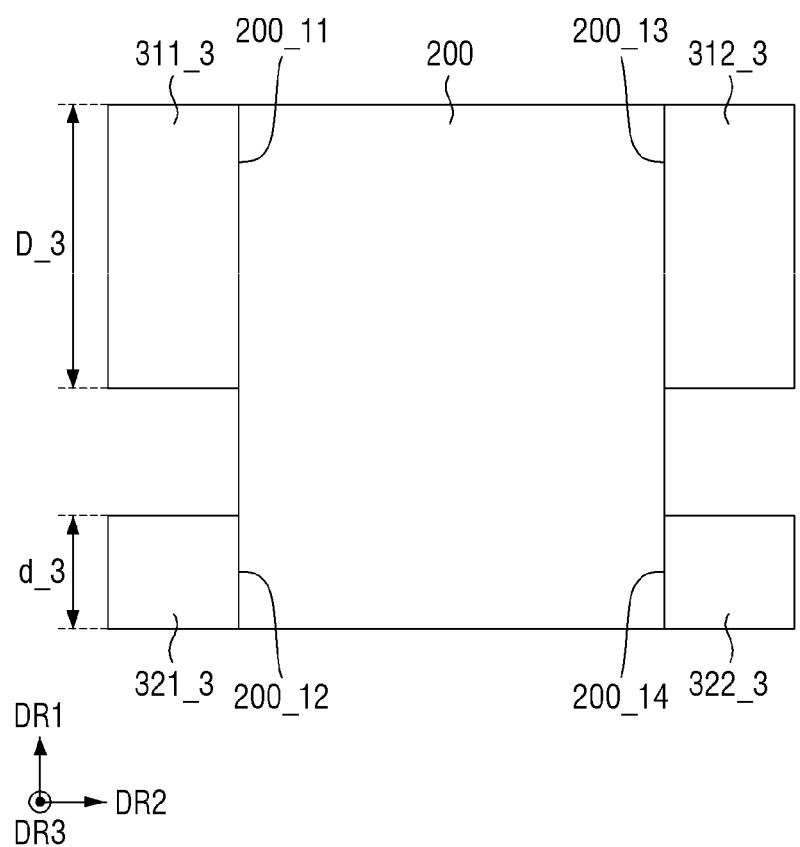
FIG. 8 is a schematic layout view illustrating a semiconductor device, according to some example embodiments of the present disclosure.

FIG. 8 is a schematic layout view illustrating a semiconductor device according to some example embodiments of the present disclosure. For convenience of description, the same or repeated description of that of FIGS. 1 to 5 will be briefly made or omitted.

Referring to FIG. 8, lengths of the plurality of source/drain areas 300 along the first direction DR1 may be different from each other. In detail, a length D_3 of the first source/drain area 311_3 along the first direction DR1, which is disposed to be adjacent to the (1_1)th side 200_11 of the gate structure 200, may be longer than a length d_3 of the third source/drain area 321_3 along the first direction DR1, which is disposed to be adjacent to the (1_2)th side 200_12 of the gate structure 200.

In addition, a length of the second source/drain area 312_3 along the first direction DR1, which is disposed to be adjacent to the (1_3)th side 200_13 of the gate structure 200, may be longer than that of the fourth source/drain area 322_3 along the first direction DR1, which is disposed to be adjacent to the (1_4)th side 200_14 of the gate structure 200. In some embodiments, the length D_3 of the first source/drain area 311_3 along the first direction DR1 may be the same as the length of the second source/drain area 312_3 along the first direction DR1, and the length d_3 of the third source/drain area 321_3 along the first direction DR1 may be the same as the length of the fourth source/drain area 322_3 along the first direction DR1.

In this case, the first source/drain area 311_3 and the second source/drain area 312_3 may be source areas, and the third source/drain area 321_3 and the fourth source/drain area 322_3 may be drain areas.

Figure 9:
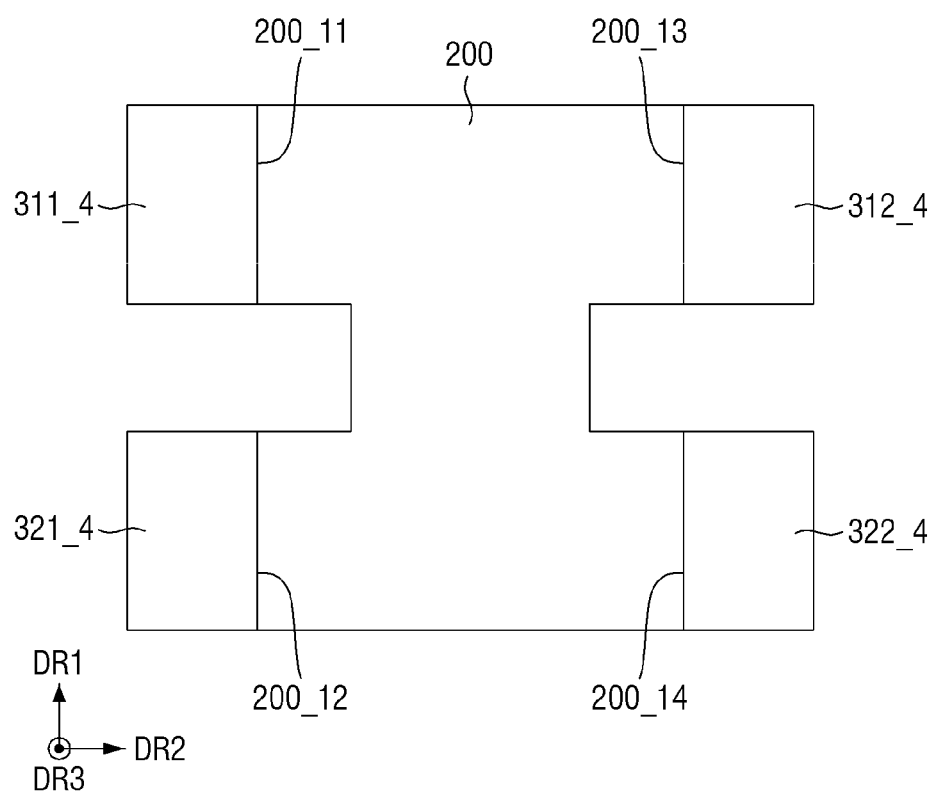
FIG. 9 is a schematic layout view illustrating a semiconductor device, according to some example embodiments of the present disclosure.

FIG. 9 is a schematic layout view illustrating a semiconductor device according to some example embodiments of the present disclosure. For convenience of description, the same or repeated description of that of FIGS. 1 to 5 will be briefly made or omitted.

Referring to FIG. 9, a first source/drain area 311_4 disposed to be adjacent to the (1_1)th side 200_11 of the gate structure 200, a second source/drain area 312_4 disposed to be adjacent to the (1_3)th side 200_13 of the gate structure 200, and a third source/drain area 321_4 disposed to be adjacent to the (1_2)th side 200_12 of the gate structure 200 may be source areas. In addition, the fourth source/drain area 322_4 disposed to be adjacent to the (1_4)th side 200_14 of the gate structure 200 may be a drain area. That is, three source/drain areas may be source areas, and one source/drain area may be a drain area.

Positions of the plurality of source areas may be variously formed without being limited to the specific sidewalls of the gate structure described above.

Meanwhile, the technical spirits of the present disclosure are not limited to the above example, and three source/drain areas may be drain areas, and one source/drain area may be a source area.

Although not shown in detail, depths of the first source/drain area 311_4, the second source/drain area 312_4, and the third source/drain area 321_4 along the third direction DR3 may be deeper than a depth of the fourth source/drain area 322_4 along the third direction DR3, but the technical spirits of the present disclosure are not limited thereto. When the first to third source/drain areas 311_4, 312_4 and 321_4 are the drain areas and the fourth source/drain area 322_4 is the source area, the depths of the first source/drain area 311_4, the second source/drain area 312_4, and the third source/drain area 321_4 along the third direction DR3 may be shallower than the depth of the fourth source/drain area 322_4 along the third direction DR3.

Figure 10:
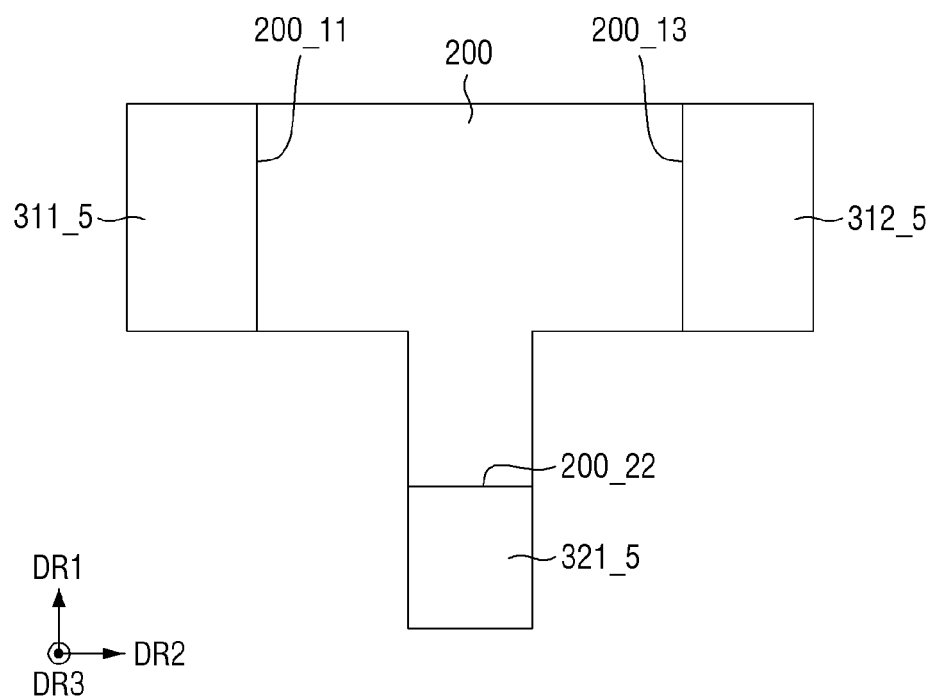
FIG. 10 is a schematic layout view illustrating a semiconductor device, according to some example embodiments of the present disclosure.

FIG. 10 is a schematic layout view illustrating a semiconductor device according to some example embodiments of the present disclosure. For convenience of description, the same or repeated description of that of FIGS. 1 to 5 will be briefly made or omitted.

Referring to FIG. 10, a first source/drain area 311_5 disposed to be adjacent to the (1_1)th side 200_11 of the gate structure 200 and a second source/drain area 312_5 disposed to be adjacent to the (1_3)th side 200_13 of the gate structure 200 may be source areas, and a third source/drain area 321_5 disposed to be adjacent to the (2_2)th side 200_22 of the gate structure 200 may be a drain area. In this case, the third source/drain area 321_5 may overlap the (2_2)th side 200_22 in the third direction DR3. That is, two source/drain areas may be source areas, and one source/drain area may be a drain area. In addition, a drain area may be disposed between the two source/drain areas. In this case, the gate structure 200 may have a T-shape.

Positions of the plurality of source areas may be variously formed without being limited to the specific sidewalls of the gate structure described above.

Meanwhile, the technical spirits of the present disclosure are not limited to the above example, and two source/drain areas may be drain areas, and one source/drain area may be a source area.

Although not shown in detail, depths of the first source/drain area 311_5 and the second source/drain area 312_5 along the third direction DR3 may be deeper than a depth of the third source/drain area 321_5 along the third direction DR3, but the technical spirits of the present disclosure are not limited thereto. When the first and second source/drain areas 311_5 and 312_5 are the drain areas and the third source/drain area 321_5 is the source area, the depths of the first source/drain area 311_5 and the second source/drain area 312_5 along the third direction DR3 may be shallower than the depth of the third source/drain area 321_5 along the third direction DR3.

Figure 11:
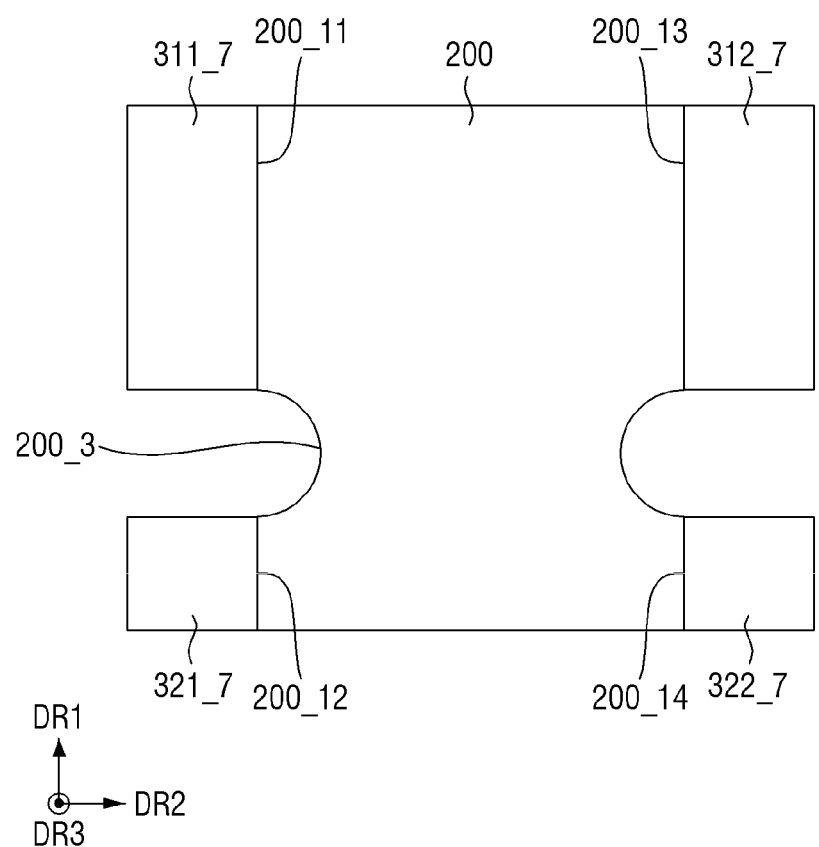
FIG. 11 is a schematic layout view illustrating a semiconductor device, according to some example embodiments of the present disclosure.

FIG. 11 is a schematic layout view illustrating a semiconductor device according to some example embodiments of the present disclosure. For convenience of description, the same or repeated description of that of FIGS. 1 to 5 will be briefly made or omitted.

Referring to FIG. 11, an inner wall 200_3 of the gate structure 200 may have a rounded curve shape. In this case, the exposed area of the gate structure 200 formed as at least a portion of the gate structure 200 is etched may be rounded.

The inner wall 200_3 of the gate structure 200 may be between the first source/drain area 311_7, which is disposed to be adjacent to the (1_1)th side 200_11 of the gate structure 200, and the third source/drain area 321_7, which is disposed to be adjacent to the (1_2)th side 200_12 of the gate structure 200. In addition, the inner wall 200_3 of the gate structure 200 may be between the second source/drain area 312_7, which is disposed to be adjacent to the (1_3)th side 200_13 of the gate structure 200, and the fourth source/drain area 322_7, which is disposed to be adjacent to the (1_4)th side 200_14 of the gate structure 200.

Although not shown in detail, the side of the trench 120T may be rounded also.

Figure 12:
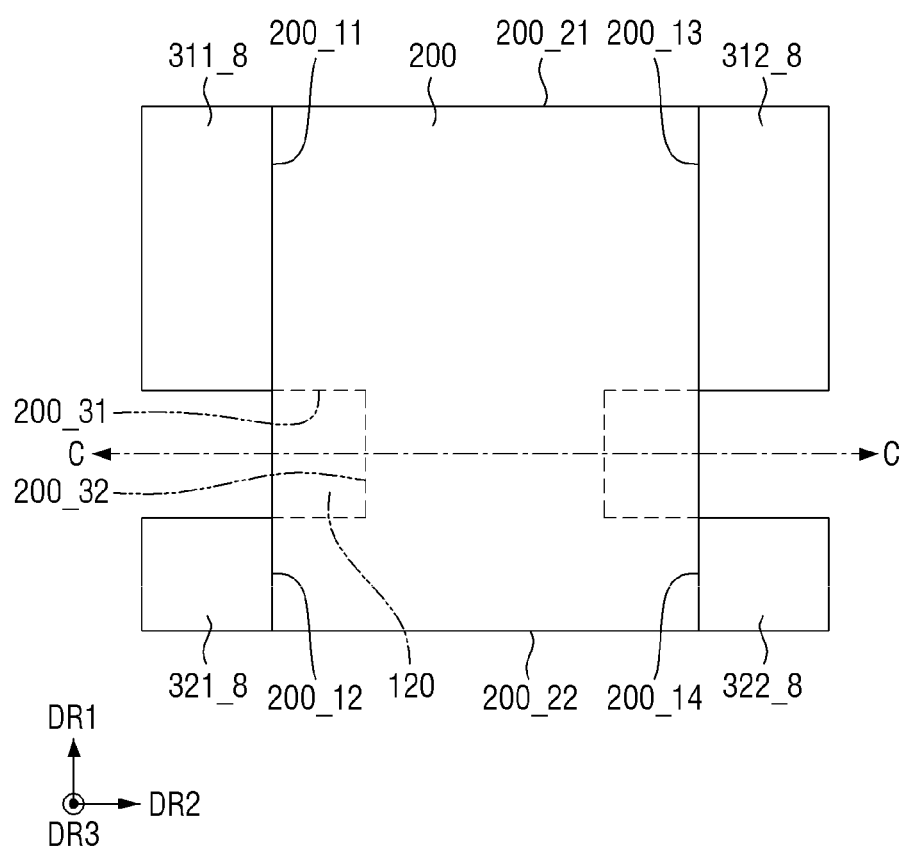
FIG. 12 is a schematic layout view illustrating a semiconductor device, according to some example embodiments of the present disclosure.
Figure 13:
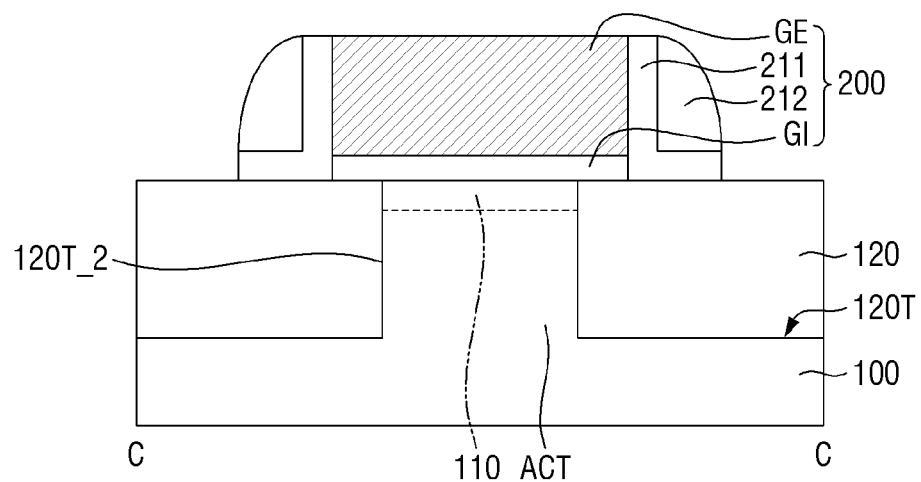
FIG. 13 is a cross-sectional view taken along line C-C of FIG. 12.

FIG. 12 is a schematic layout view illustrating a semiconductor device according to some example embodiments of the present disclosure. FIG. 13 is a cross-sectional view taken along line C-C of FIG. 12. For convenience of description, the same or repeated description of that of FIGS. 1 to 5 will be briefly made or omitted.

Referring to FIG. 12, lengths of the plurality of source/drain areas 300 along the first direction DR1 may be different from each other.

The semiconductor device of FIGS. 12 and 13 may include a first source/drain area 311_8, which is disposed to be adjacent to the (1_1)th side 200_11 of the gate structure 200, a second source/drain area 312_8, which is disposed to be adjacent to the (1_3)th side 200_13 of the gate structure 200, a third source/drain area 321_8, which is disposed to be adjacent to the (1_2)th side 200_12 of the gate structure 200, and a fourth source/drain area 322_8, which is disposed to be adjacent to the (1_4)th side 200_14 of the gate structure 200.

Referring to FIGS. 12 and 13, at least a portion of the substrate 100 may be etched such that the second side 120T_2 of the trench 120T is disposed at a different level from the second inner wall 200_32 of the gate structure 200 shown in FIG. 1 in the third direction DR3. For example, the second side 120T_2 of the trench 120T may not be aligned in the third direction D3 with the second inner wall 200_32 of the gate structure 200.

As a result, the second side 120T_2 may be disposed to be more adjacent to the center of the gate structure 200 than the first sides 200_11, 200_12, 200_13 and 200_14 of the gate structure 200 based on the second direction DR2. For example, the second side 120T_2 of the trench 120T may be disposed beneath portions of the gate electrode GE and the gate insulating layer GI.

Figure 14:
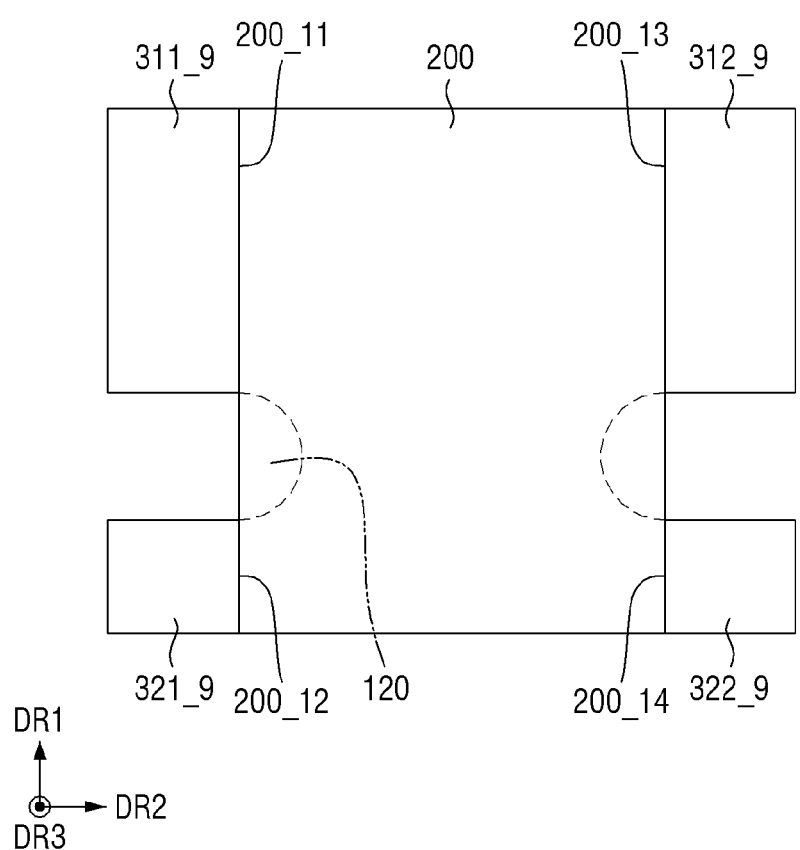
FIG. 14 is a schematic layout view illustrating a semiconductor device, according to some example embodiments of the present disclosure.

FIG. 14 is a schematic layout view illustrating a semiconductor device according to some embodiments of the present disclosure. For convenience of description, the same or repeated description of that of FIGS. 1 to 5 will be briefly made or omitted.

The semiconductor device of FIG. 14 may include a first source/drain area 311_9, which is disposed to be adjacent to the (1_1)th side 200_11 of the gate structure 200, a second source/drain area 312_9, which is disposed to be adjacent to the (1_3)th side 200_13 of the gate structure 200, a third source/drain area 321_9, which is disposed to be adjacent to the (1_2)th side 200_12 of the gate structure 200, and a fourth source/drain area 322_9, which is disposed to be adjacent to the (1_4)th side 200_14 of the gate structure 200.

Referring to FIG. 14, lengths of the plurality of source/drain areas 300 along the first direction DR1 may be different from each other.

Referring to FIG. 14, at least a portion of the substrate 100 may be etched such that the side of the trench 120T is disposed at a different level from the second inner wall 200_32 of the gate structure 200 shown in FIG. 1 in the third direction DR3. For example, the side of the trench 120T may be disposed beneath portions of the gate electrode GE and the gate insulating layer GI.

In this case, the side of the trench 120T may be a rounded curved shape.

Figure 15:
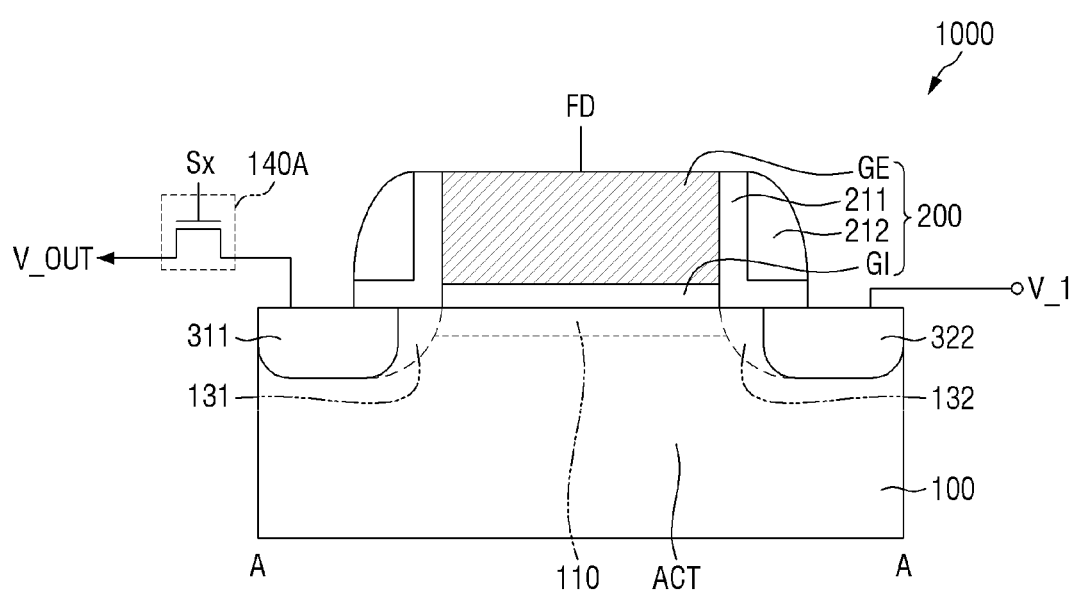
FIG. 15 is a schematic cross-sectional view illustrating a structure of a source follower transistor, according to some example embodiments of the present disclosure.
Figure 16:
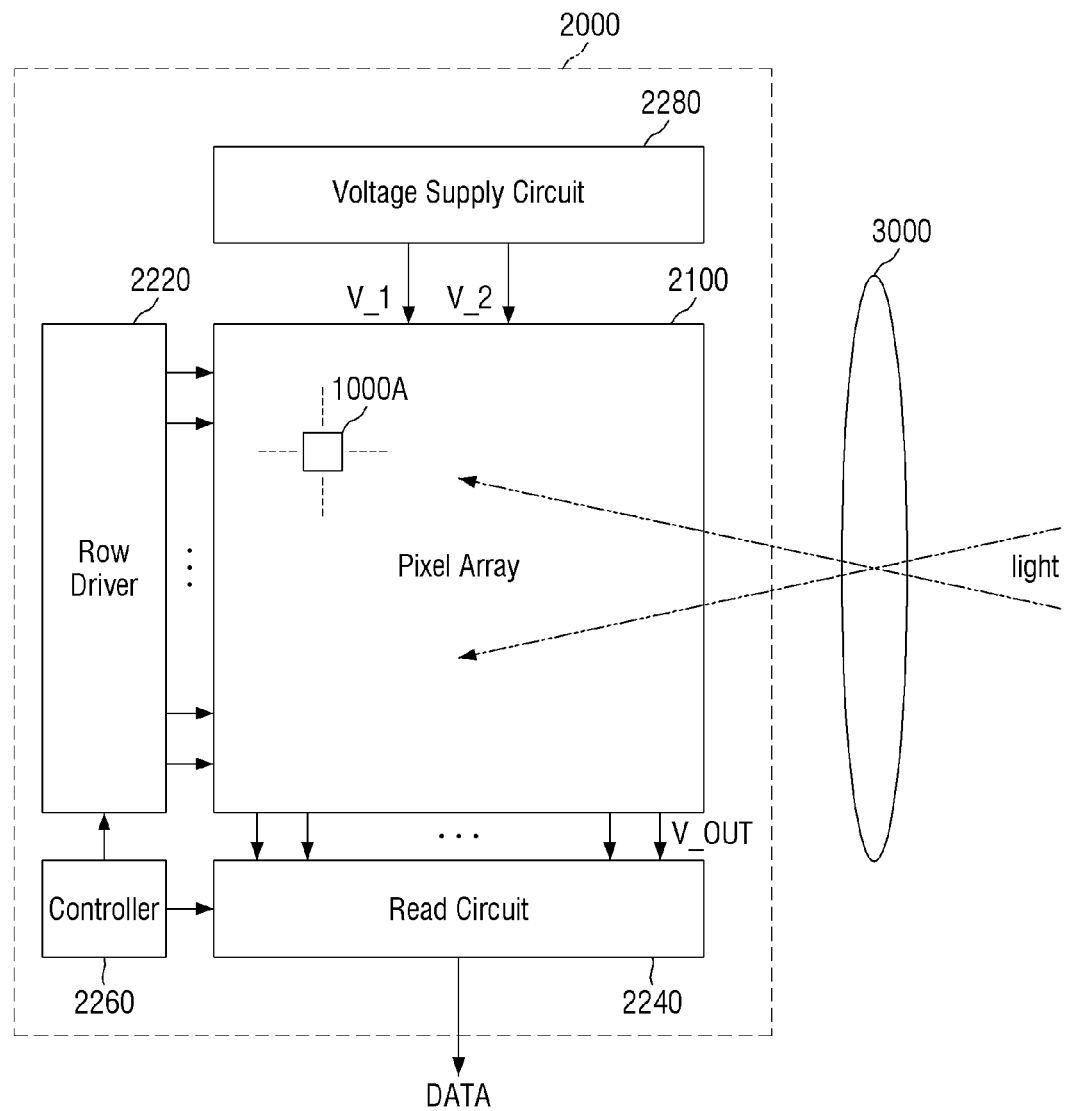
FIG. 16 is a view illustrating an image sensor, according to some example embodiments of the present disclosure.
Figure 17:
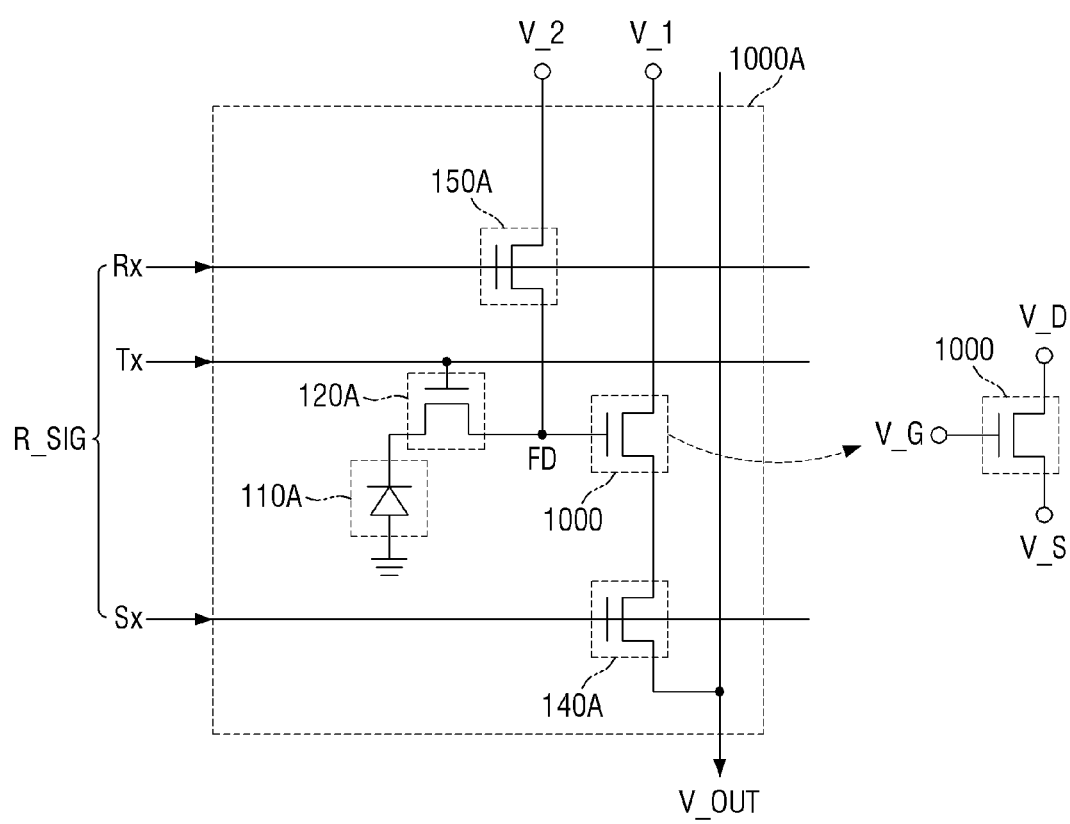
FIG. 17 is a schematic circuit view illustrating a structure of a pixel, according to some example embodiments of the present disclosure.

FIG. 15 is a schematic cross-sectional view illustrating a structure of a source follower transistor according to some example embodiments of the present disclosure. FIG. 16 is a view illustrating an image sensor according to some example embodiments of the present disclosure. FIG. 17 is a schematic circuit view illustrating a structure of a pixel according to some example embodiments of the present disclosure. For convenience of description, the same or repeated description of that of FIGS. 1 to 5 will be briefly made or omitted.

Referring to FIG. 15, the semiconductor device 1000 may be a source follower transistor 1000, and may include a substrate 100, a gate structure 200, and a plurality of source/drain areas 300 (e.g., first to fourth source/drain areas 311, 312, 321, and 322). Hereinafter, the description of the semiconductor device 1000 described with reference to FIGS. 1 to 14 may equally be applied to the source follower transistor 1000 of FIGS. 15 to 17. The semiconductor device 1000 according to some embodiments may be applied to various types of transistors without being limited to the source follower transistor 1000.

The first source/drain area 311 and the second source/drain area 322 may include impurities of a first conductive type or a second conductive type. In example embodiments, the first source/drain area 311 may be a source area and the second source/drain area 322 may be a drain area. The gate structure 200 may include a conductive material, and the gate insulating layer GI may include an insulating material to insulate the gate structure 200.

A channel that is a path through which carriers such as charges move from the first source/drain area 311 to the second source/drain area 322 may be formed in accordance with a voltage applied to the gate structure 200 of the source follower transistor 1000. According to some embodiments, the channel may be formed in a portion spaced apart from the gate insulating layer GI at a predetermined distance in the substrate 100.

Referring to FIGS. 1 and 15, the plurality of source/drain areas 300 may include first and second source/drain areas 311 and 312 that respectively overlap the (1_1)th and (1_3)th sides 200_11 and 200_13 of the gate structure 200 in the third direction DR3 and spaced apart from each other in the second direction DR2, and a third source/drain area 321 or 322 that overlaps at least one of the (1_2)th or (1_4)th side 200_12 or 200_14 of the gate structure 200 in the third direction DR3 and spaced apart from at least one of the first or second source/drain areas 311 or 312 in the first direction DR1.

In this case, the voltage applied to the first and second source/drain areas 311 and 312 and the voltage applied to the third source/drain area 321 or 322 may be different from each other. In this case, the voltage applied to the first and second source/drain areas 311 and 312 may operate based on a value different from the voltage applied to the third source/drain area 321 or 322.

As shown in FIG. 16, a module lens 3000 may allow light to enter the image sensor 2000 by refracting the light. The image sensor 2000 may output data DATA according to the incident light, and the output data may be processed into image data by an image processor or the like.

Referring to FIG. 16, the image sensor 2000 may include a pixel array 2100, a row driver 2220, a read circuit 2240, a controller 2260, and a voltage supply circuit 2280. The pixel array 2100 may include a plurality of pixels 1000A. Each pixel 1000A may include a light sensing element, and the light sensing element may generate an electrical signal according to intensity of light that is absorbed. The pixels 1000A may be controlled by a row signal R_SIG output by the row driver 2220. For example, each pixel 1000A may include at least one transistor, and a gate of the transistor may be connected to the row signal R_SIG. Each pixel 1000A may also include a transistor that amplifies the electrical signal generated by the light sensing element, and may include, for example, the source follower transistor 1000 shown in FIG. 15.

The pixels 1000A included in one row of the pixel array 2100 may be controlled by the same row signal R_SIG. The pixels 1000A may output a signal according to the electrical signal generated by the light sensing element. For example, the pixels 1000A included in one column of the pixel array 2100 may output an output voltage V_OUT to the outside of the pixel array 2100 through the same signal line.

The row driver 2220 may be controlled by the controller 2260, and may control each pixel 1000A included in the pixel array 2100 by outputting the row signal R_SIG. For example, the row driver 2220 may control the light sensing element of the pixel 1000A through the row signal R_SIG to reset a node to which the electrical signal generated by absorbing light is transferred, or to move the generated electrical signal to the outside of the pixel.

The read circuit 2240 may receive the output voltage V_OUT from the pixel array 2100, and may output the data DATA according to the output voltage V_OUT. For example, the read circuit 2240 may include an analog-to-digital converter ADC, and the ADC may receive the output voltage V_OUT, which is an analog signal, and may output the data DATA that is a digital signal. The controller 2260 may output at least one control signal, and may control the row driver 2220 and the read circuit 2240 through the control signal.

The voltage supply circuit 2280 may supply a voltage to the pixel array 2100. For example, as shown in FIG. 16, the voltage supply circuit 2280 may generate first and second voltages V_1 and V_2 to supply the first and second voltages V_1 and V_2 to the pixel array 2100. The first and second voltages V_1 and V_2 may be applied to the transistor included in the pixel 1000A of the pixel array 2100.

Referring to FIG. 17, the pixel 1000A may be controlled by the row signal R_SIG, and may output the output voltage V_OUT. As shown in FIG. 17, the pixel 1000A may include a transfer transistor 120A, a source follower transistor 1000, a selection transistor 140A, and a reset transistor 150A. The row signal R_SIG by the pixel 1000A from the row driver 2220 may include a reset signal Rx, a transfer signal Tx, and a selection signal Sx. The transistor included in the pixel 1000A may be a MOS transistor.

The pixel 1000A may include a light sensing element 110A that absorbs light to generate an electrical signal, and the light sensing element 110A may be, for example, a photodiode, a photogate, or a phototransistor. Hereinafter, although the light sensing element 110A is described as being a photodiode as shown in FIG. 17, the present disclosure is not limited thereto.

The transfer transistor 120A may allow charges accumulated by the light sensing element 110A to pass through a floating diffusion area FD or block the charges in accordance with the transfer signal Tx. For example, while the light sensing element 110A is accumulating charges by absorbing light, a transfer signal Tx of a voltage capable of turning off the transfer transistor 120A may be applied to the gate of the transfer transistor 120A. In addition, when the light sensing element 110A accumulates charges for a predetermined time, a transfer signal Tx of a voltage capable of turning on the transfer transistor 120A may be applied to the gate of the transfer transistor 120A.

The source follower transistor 1000 may amplify a voltage of the floating diffusion area FD, and the selection transistor 140A may selectively output the amplified voltage in accordance with the selection signal Sx. The reset transistor 150A may connect or disconnect the floating diffusion area FD with or from the second voltage V_2 in accordance with the reset signal Rx, thereby setting the voltage of the floating diffusion area FD to a reset voltage approximate to the second voltage V_2. In this way, the pixel 1000A that includes an element for amplifying the electrical signal converted from the light absorbed by the light sensing element 110A may be referred to as an active pixel sensor (APS).

As shown in FIG. 17, the voltage of the floating diffusion area FD may be applied to the gate structure of the source follower transistor 1000, and the first voltage V_1 may be applied to a drain area. Therefore, the source follower transistor 1000 may output a voltage according to the voltage of the floating diffusion area FD through the drain area.

Referring to FIGS. 16 and 17, the first and second voltages V_1 and V_2 may be generated by the voltage supply circuit 2280 of the image sensor 2000. The second voltage V_2 is intended to reset the floating diffusion area FD through the reset transistor 150A. Since the floating diffusion area FD is reset in a state in which the transfer transistor 120A is turned off, a current based on movement of charges trapped in the floating diffusion area FD before the floating diffusion area FD is reset may flow.

As shown in FIG. 17, voltages of gate, source, and drain areas of the source follower transistor 1000 included in the pixel 1000A may be referred to as V_G, V_S and V_D, respectively. V_G, V_S and V_D may respectively represent voltages of the gate, source, and drain areas of the source follower transistor 1000 based on a ground voltage.

Although the embodiments of the present disclosure have been described with reference to the accompanying drawings, it will be apparent to those skilled in the art that the present disclosure can be embodied in other specific forms without departing from the technical spirits and essential characteristics of the present disclosure. Thus, the above embodiments are to be considered in all respects as illustrative and not restrictive.

What is claimed is:

1. A semiconductor device comprising:
   a substrate extended in first and second directions crossing each other;
   a gate structure disposed on the substrate, the gate structure including first and second sides extended in parallel with the first direction and spaced apart from each other in the second direction, and a third side extended in parallel with the second direction; and
   a plurality of source/drain areas of a first conductive type, which are disposed in the substrate,
   wherein the plurality of source/drain areas include first and second source/drain areas spaced apart from each other in the second direction and a third source/drain area spaced apart from at least one of the first or second source/drain area in the first direction,
   wherein the first and second source/drain areas overlap the first and second sides in a third direction perpendicular to the first and second directions, respectively,
   wherein the third source/drain area overlaps one of the third side or a fourth side of the gate structure in the third direction, the fourth side extended in parallel with the first direction and spaced apart from one of the first side or the second side in the first direction,
   wherein a length of the first source/drain area in the first direction is the same as a length of the first side in the first direction and a length of the second source/drain area the first direction is the same as a length of the second side in the first direction,
   wherein a voltage applied to the first and second source/drain areas and a voltage applied to the third source/drain area operate based on their respective values different from each other, and
   wherein from a planar viewpoint, the gate structure is I-shaped.

2. The semiconductor device of claim 1, wherein the voltage applied to the third source/drain area is greater than the voltage applied to the first and second source/drain areas.

3. The semiconductor device of claim 1, wherein the voltage applied to the third source/drain area is smaller than the voltage applied to the first and second source/drain areas.

4. The semiconductor device of claim 1, wherein a length of at least one of the first or second source/drain area and a length of the third source/drain area are different from each other in the first direction.

5. The semiconductor device of claim 1, further comprising a fourth source/drain area that overlaps the second side of the gate structure in the third direction and is spaced apart from each of the first and second source/drain areas in the first direction.

6. The semiconductor device of claim 5, wherein the voltage applied to the third source/drain area is greater than the voltage applied to the fourth source/drain area.

7. The semiconductor device of claim 5, wherein the voltage applied to the third source/drain area is smaller than the voltage applied to the fourth source/drain area.

8. The semiconductor device of claim 1, wherein the gate structure includes a first inner wall extended from the first side along the second direction and a second inner wall connected to the first inner wall and extended along the first direction.

9. The semiconductor device of claim 1,
   wherein a trench defining an active area between the substrate and the gate structure and an insulating layer filling the trench are formed in the substrate, and
   wherein the insulating layer is disposed between the first and third source/drain areas.

10. The semiconductor device of claim 9, wherein the trench includes a first side surface extended from the first side of the gate structure along the second direction and a second side surface connected to the first side surface and extended along the first direction.

11. The semiconductor device of claim 1, wherein depths of the plurality of source/drain areas are different from each other.

12. A semiconductor device comprising:
    a substrate extended in first and second directions crossing each other;
    a gate structure disposed on the substrate, including first and second sides extended in parallel with the first direction and spaced apart from each other in the second direction; and
    a plurality of source/drain areas disposed in the substrate,
    wherein the plurality of source/drain areas include first and second source areas spaced apart from each other in the second direction and a drain area spaced apart from the first and second source areas,
    wherein the first and second source areas overlap the first or second sides of the gate structure in a third direction perpendicular to the first and second directions, and having first conductive type impurities,
    wherein a length of the first source area in the first direction is the same as a length of the first side in the first direction and a length of the second source area in the first direction is the same as a length of the second side in the first direction, and
    wherein from a planar viewpoint, the gate structure is I-shaped.

13. The semiconductor device of claim 12, wherein a length of at least one of the plurality of source areas is longer than a length of the drain area in the first direction.

14. The semiconductor device of claim 12,
    wherein the source/drain area includes first and second source areas that overlap the first and second sides of the gate structure, respectively, in the third direction and are spaced apart from each other in the second direction to face each other, and
    wherein a first drain area that overlaps the first side of the gate structure in the third direction and is spaced apart from at least one of the first or second source area in the first direction.

15. The semiconductor device of claim 14, wherein the plurality of source areas further include a third source area that overlaps the second side of the gate structure in the third direction and is spaced apart from each of the first and second source areas in the first direction.

16. The semiconductor device of claim 14, wherein the gate structure includes a first inner wall extended from the first side along the second direction and a second inner wall connected to the first inner wall and extended along the first direction.

17. The semiconductor device of claim 16,
wherein a trench defining an active area between the substrate and the gate structure and an insulating layer filling the trench are formed in the substrate, and
wherein the trench includes a first side surface extended from the first side of the gate structure along the second direction and a second side surface connected to the first side surface and extended along the first direction.

18. The semiconductor device of claim 17, wherein the second side surface of the trench is disposed to be more adjacent to a center of the gate structure than the first side of the gate structure based on the second direction.

19. An image sensor comprising:
a gate structure to which a voltage according to charges accumulated by a light sensing element is applied, the gate structure including first and second sides extended in parallel with a first direction and spaced apart from each other in a second direction crossing the first direction, and a third side extended in parallel with the second direction; and
a source follower transistor including a plurality of source/drain areas of a first conductive type,
wherein the plurality of source/drain areas include first and second source/drain areas spaced apart from each other in the second direction and a third source/drain area spaced apart from at least one of the first or second source/drain area in the first direction,
wherein the first and second source/drain areas overlap the first and second sides in a third direction perpendicular to the first and second directions, respectively,
wherein the third source/drain area overlaps one of the third side or a fourth side of the gate structure in the third direction the fourth side extended in parallel with the first direction and spaced apart from one of the first side or the second side in the first direction,
wherein a length of the first source/drain area in the first direction is the same as a length of the first side in the first direction and a length of the second source/drain area in the first direction is the same as a length of the second side in the first direction,
wherein a voltage applied to the first and second source/drain areas and a voltage applied to the third source/drain area operate based on their respective values different from each other, and
wherein from a planar viewpoint, the gate structure is I-shaped.

* * * * *